United States Patent
Jang

(10) Patent No.: US 10,627,046 B1
(45) Date of Patent: Apr. 21, 2020

(54) DETACHABLE RING HOLDER, COMPATIBLE WITH WIRELESS CHARGING, FOR SMARTPHONE

(71) Applicant: AAUXX USA, Inc., Irvine, CA (US)

(72) Inventor: Jin Tae Jang, Goyang-si (KR)

(73) Assignee: AAUXX USA, INC., Garden Grove, CA (US)

( * ) Notice: Subject to any disclaimer, the term of this patent is extended or adjusted under 35 U.S.C. 154(b) by 0 days.

(21) Appl. No.: 16/145,533

(22) Filed: Sep. 28, 2018

(51) Int. Cl.
| | |
|---|---|
| F16M 13/00 | (2006.01) |
| H02J 7/00 | (2006.01) |
| H05K 5/00 | (2006.01) |
| F16M 13/04 | (2006.01) |
| H05K 5/02 | (2006.01) |
| F16M 13/06 | (2006.01) |
| G06F 1/16 | (2006.01) |
| H02J 7/02 | (2016.01) |
| H04B 1/3877 | (2015.01) |

(52) U.S. Cl.
CPC ............ *F16M 13/04* (2013.01); *F16M 13/06* (2013.01); *G06F 1/1633* (2013.01); *H02J 7/025* (2013.01); *H04B 1/3877* (2013.01); *H05K 5/0086* (2013.01); *H05K 5/0226* (2013.01); *H05K 5/0234* (2013.01)

(58) Field of Classification Search
CPC ........... F16M 13/06; F16M 13/04; G06F 1/16
USPC ......................................................... 320/108
See application file for complete search history.

(56) References Cited

U.S. PATENT DOCUMENTS

| | | |
|---|---|---|
| D335,231 S | 5/1993 | Bengtson |
| D426,491 S | 6/2000 | Chan |
| D438,451 S | 3/2001 | Reiter |
| D454,482 S | 3/2002 | Morita |
| D461,400 S | 8/2002 | Aoki |
| 6,522,748 B1 | 2/2003 | Wang |
| 6,888,940 B1 | 5/2005 | Deppen |
| 7,319,893 B2 * | 1/2008 | Kato et al. .......... H04M 1/0237 379/433.12 |
| D691,879 S | 10/2013 | Bernard |
| D696,673 S | 12/2013 | Vogel |
| D709,066 S | 7/2014 | Byun |

(Continued)

FOREIGN PATENT DOCUMENTS

| | | |
|---|---|---|
| JP | 201158607 | 3/2011 |
| JP | 3170743 | 9/2011 |

(Continued)

OTHER PUBLICATIONS

Jang, Application No. PCT/KR2014/002857 filed Apr. 4, 2014, International Search Report dated Jun. 25, 2014, 2 pages.

(Continued)

*Primary Examiner* — Sun J Lin
(74) *Attorney, Agent, or Firm* — Patterson Thuente Pedersen, PA

(57) ABSTRACT

Systems, devices, and methods for providing a ring holder stand for a portable digital device, such as a smartphone, tablet, portable media player and the like, that can be easily separated from and re-attached to the portable digital device as needed by a user, so that the ring holder stand can be removed while the portable digital device is being recharged so as to stop the chances of causing fire or thermal burn that may occur if the metal ring holder stand remains attached to the portable digital device.

12 Claims, 7 Drawing Sheets

(56) References Cited

U.S. PATENT DOCUMENTS

| | | |
|---|---|---|
| D715,132 S | 10/2014 | Mcsweyn et al. |
| 9,421,920 B2 * | 8/2016 | Jang .................... A45F 5/00 |
| D765,646 S | 9/2016 | Deng et al. |
| D769,234 S | 10/2016 | Rami |
| D778,714 S | 2/2017 | Mcsweyn et al. |
| D781,297 S | 3/2017 | Liao |
| D790,960 S | 7/2017 | Mcsweyn et al. |
| D805,021 S | 12/2017 | Cunningham |
| D807,339 S | 1/2018 | Lan |
| D809,449 S | 2/2018 | Zhang |
| D820,663 S | 6/2018 | Jang |
| 2005/0119034 A1 * | 6/2005 | Kato et al. .......... H04M 1/0237 455/575.4 |
| 2006/0140395 A1 | 6/2006 | Kim |
| 2007/0215659 A1 | 9/2007 | Knapp et al. |
| 2009/0090750 A1 | 4/2009 | Alcenat |
| 2012/0286118 A1 | 11/2012 | Richards |
| 2013/0276212 A1 | 10/2013 | Lee-Holowka et al. |
| 2013/0279098 A1 | 10/2013 | Cho |
| 2016/0344225 A1 | 11/2016 | Bailey |
| 2017/0163070 A1 | 6/2017 | Lawrenson et al. |
| 2017/0338859 A1 | 11/2017 | Figgers |
| 2018/0010727 A1 * | 1/2018 | Jang .................... H04M 1/04 |

FOREIGN PATENT DOCUMENTS

| | | |
|---|---|---|
| KR | 1020110016335 | 2/2011 |
| KR | 200453348 | 4/2011 |
| KR | 101062557 | 8/2011 |
| KR | 101062570 | 8/2011 |
| KR | 1020120035810 | 4/2012 |
| WO | 20120896908 | 6/2012 |
| WO | 2012096471 | 7/2012 |

OTHER PUBLICATIONS

AAUXX Korea Co., Ltd., Application No. PCT/KR2014/002857 filed Apr. 4, 2014, Written Opinion of the International Searching Authority dated Jun. 25, 2014, 6 pages.

* cited by examiner

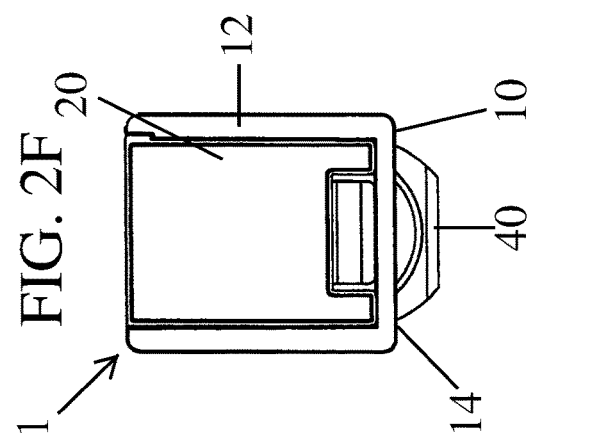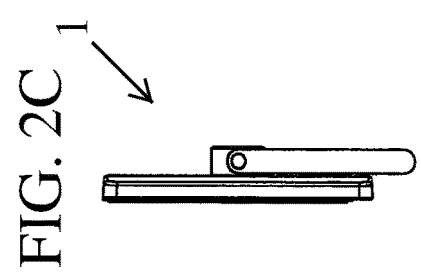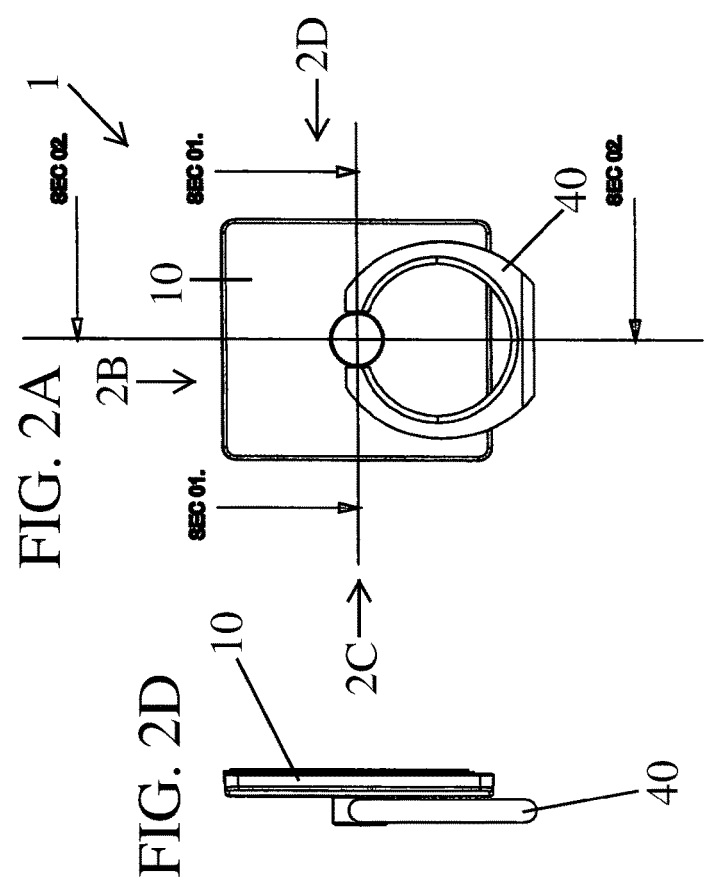

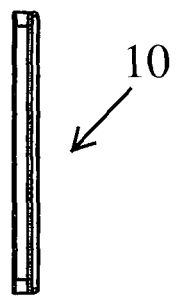
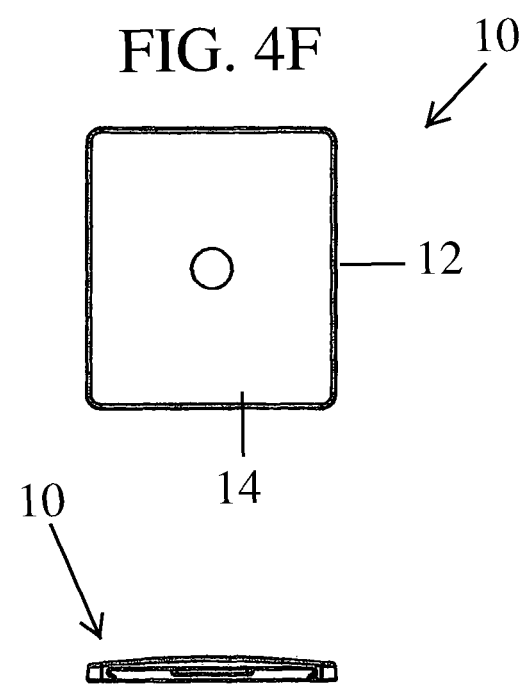

DETACHABLE RING HOLDER, COMPATIBLE WITH WIRELESS CHARGING, FOR SMARTPHONE

FIELD OF INVENTION

This invention relates to smartphones, and in particular to systems, devices, and methods for providing a ring holder stand for a portable digital device, such as a smartphone, tablet, portable media player and the like, that can be easily separated and re-attached as needed by a user, so that the ring holder stand can be removed while the portable digital device is being recharged so as to stop the chances of causing fire or thermal burn that may occur if the metal ring holder stand remains attached to the portable digital device.

BACKGROUND AND PRIOR ART

It has become popular to use a Qi wireless charging application for a mobile phone, such as a smartphone, and the like, which can include an AC (alternating current) charging plate/base station that can be powered by a household power supply. The charging plate/base station can include a transmitter coil which can generate a magnetic field that can induce a voltage a receiver coil inside of a closed located smartphone, which can charge a battery in the smartphone. This magnetic resonance type charging technology is also described in for example, U.S. Published Patent Applications: 2017/0163070 to Lawrenson et al. and 2017/0338859 to Figgers, which are incorporated by reference in their entirety.

U.S. Pat. No. 9,421,920 to Jang, which is assigned to the same applicant as the subject application and is incorporated by reference, shows and describes a "mobile device accessory . . . ", title, which can use a hinged metal ring accessory adhesively attached to the back of a mobile device, such as a smartphone. The '920 patent describes an adhesive that can permanently fix the metal ring accessory to the portable. The metal ring accessory can be used for grasping the mobile device in one hand, and can be used as a stand for supporting the mobile device upright on a surface, such as a desk and the like. The smartphone shown in the '920 patent can also use magnetic type resonance charging for charging the smartphone battery. However, the use of these metal rings can cause problems.

Magnetic resonance charging can cause fire or thermal burn due to overheating caused by foreign material (for example, metal pieces) between the transmitting coil (Tx) in the charging plate/base station and the receiving coil (Rx) inside of the smartphone. Since many of the ring shaped mobile accessories are made of metal and these metal objects between the transmitting coil (Tx) and the receiving coil (Rx) can cause thermal burn from the heated parts of FOD (foreign object detection) sensor which then stops the charger.

Thus, the need exists for solutions to the above problems with the prior art.

SUMMARY OF THE INVENTION

A primary objective of the present invention is to provide systems, devices, and methods for providing a removable metal ring for the portable digital devices, such as smartphones, tablets, portable media players, and the like, that allow the battery in the portable digital device to be wireless charged without causing fire or thermal burn due to overheating since the metal ring is easily removed during the wireless charging of the portable digital device.

A secondary objective of the present invention is to provide systems, devices, and methods for providing a removable metal ring for smartphone support accessories, such as for a selfie stick, portable charger, and the like, that allow the battery in the portable digital device to be wireless charged without causing fire or thermal burn due to overheating since the metal ring is easily removed during the wireless charging of the smartphone.

A secondary objective of the present invention is to provide systems, devices, and methods for retrofitting drivable wheeled land vehicles into amphibious vehicles by attaching pontoon deployment systems to existing vehicle frames underneath the vehicles.

A preferred embodiment of the removable mobile device accessory can include a first rectangular plate to be fixed to a surface of a mobile device, a second rectangular plate, a ring being hinged to the second plate, and a sliding mechanism for allowing the second rectangular plate to be removably attached to the first plate.

The first plate can be fixed to the surface of the mobile device by an adhesive.

Side edges can be extending downward from the second plate for supporting the opposite facing grip channels for allowing the second plate to slide over the first plate.

A stopper can be used for limiting travel of the second plate sliding over the first plate.

A protruding member can be included on one of the first plate and the second plate, and a slot on another one of the first plate and the second plate, the protruding member for being inserted into the slot for locking the second plate relative to the first plate.

The mobile device can include a smartphone, a selfie stick, and the like.

A method for allowing a mobile digital device with ring holder to be safely charged without causing a fire or thermal burn due to overheating by the ring holder, can include the steps of providing a first plate to be fixed to a surface of a mobile digital device, providing a second plate, providing a ring being hinged to the second plate, sliding the second plate in a first direction to the first plate so that the second plate with the hinged ring is attached to the first plate, sliding the second plate in a second direction relative to the first plate so that the second plate with the hinged ring is removed from the first plate, and providing a wireless charge to the mobile digital device when the second plate is removed from the first plate without causing the fire or the thermal burn due to overheating during the charge.

Further objects and advantages of this invention will be apparent from the following detailed description of the presently preferred embodiments which are illustrated schematically in the accompanying drawings.

BRIEF DESCRIPTION OF THE FIGURES

The drawing figures depict one or more implementations in accord with the present concepts, by way of example only, not by way of limitations. In the figures, like reference numerals refer to the same or similar elements.

FIG. 2A is a front view of the top plate of FIG. 1 with hinge attached ring holder.

FIG. 2B is a top view of the top plate of FIG. 2A along arrow 2B.

FIG. 2C is a right side view of the top plate of FIG. 2A along arrow 2D.

FIG. 2D is a left side view of the top plate of FIG. 2A along arrow 2C.

FIG. 2E is a bottom view of the top plate of FIG. 2A along arrow 2E.

FIG. 2F is a rear view of the top plate of FIG. 2A.

FIG. 4C is a left side view of the top plate of FIG. 4A along arrow 4C.

FIG. 4D is a top view of the top plate of FIG. 4A along arrow 4D.

FIG. 4E is a bottom view of the top plate of FIG. 4A along arrow 4E.

FIG. 4F is a front view of the top plate of FIG. 4A.

DESCRIPTION OF THE PREFERRED EMBODIMENTS

Figure 1:
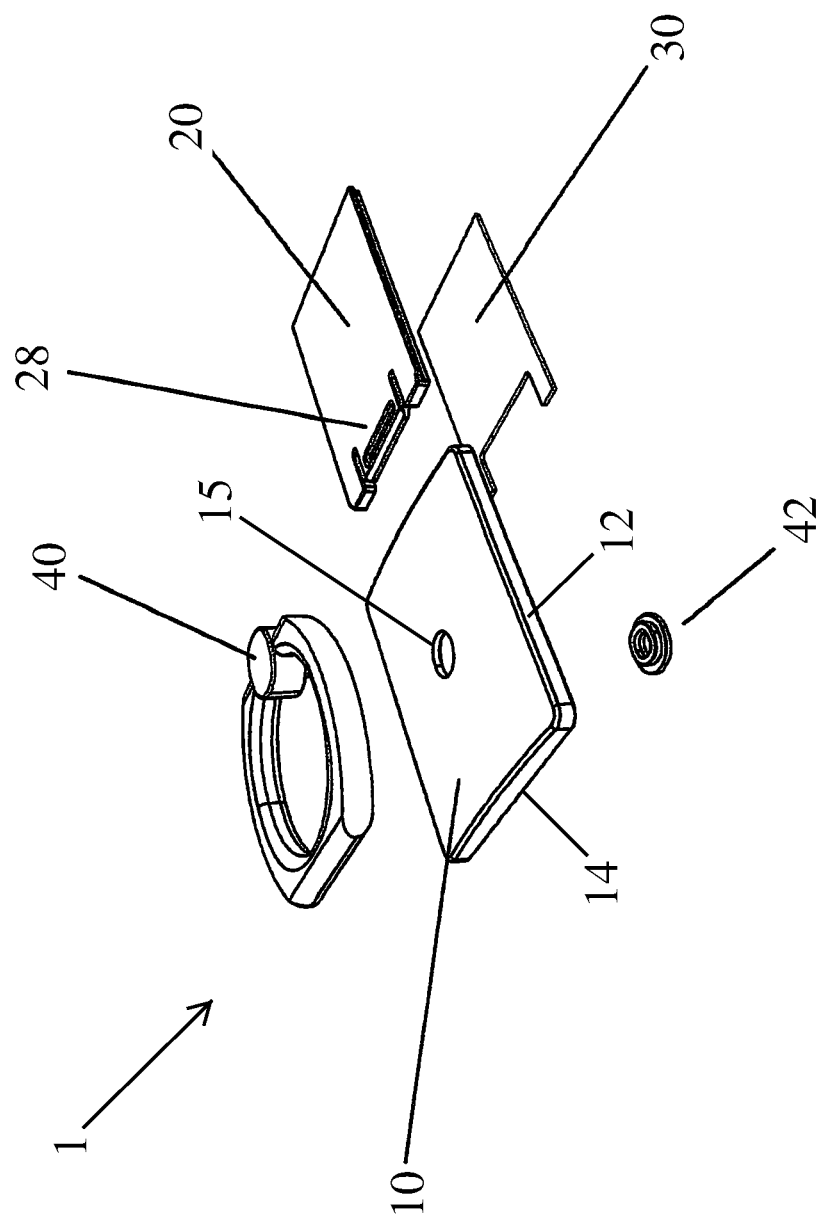
FIG. 1 is an exploded perspective view of each of the parts of the parts of the ring holder with removable top plate and bottom plate.

Before explaining the disclosed embodiments of the present invention in detail it is to be understood that the invention is not limited in its applications to the details of the particular arrangements shown since the invention is capable of other embodiments. Also, the terminology used herein is for the purpose of description and not of limitation.

In the Summary above and in the Detailed Description of Preferred Embodiments and in the accompanying drawings, reference is made to particular features (including method steps) of the invention. It is to be understood that the disclosure of the invention in this specification does not include all possible combinations of such particular features. For example, where a particular feature is disclosed in the context of a particular aspect or embodiment of the invention, that feature can also be used, to the extent possible, in combination with and/or in the context of other particular aspects and embodiments of the invention, and in the invention generally.

In this section, some embodiments of the invention will be described more fully with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will convey the scope of the invention to those skilled in the art. Like numbers refer to like elements throughout, and prime notation is used to indicate similar elements in alternative embodiments.

A list of components will now be described.
1. ring holder assembly
10 top plate
12 downwardly extending side channels/rails
14 downwardly extending rear end channel
15 opening for fastener/washer/nut 42
18 elongated protruding member
20 bottom plate
28 elongated slot
30 double sided adhesive
40 hinged ring
42 fastener, lock nut and washer
50 portable digital device (smartphone)

FIG. 1 is an exploded perspective view 1 of each of the parts of the parts of the ring holder 40 with removable top plate 10 and bottom plate 20.

FIG. 2A is a front view of the top plate 10 of FIG. 1 with hinge attached ring holder. FIG. 2B is a top view of the top plate 10 of FIG. 2A along arrow 2B. FIG. 2C is a right side view of the top plate 10 of FIG. 2A along arrow 2D. FIG. 2D is a left side view of the top plate 10 of FIG. 2A along arrow 2C. FIG. 2E is a bottom view of the top plate 10 of FIG. 2A along arrow 2E. FIG. 2F is a rear view of the top plate 10 of FIG. 2A.

Referring to FIGS. 1 and 2A-2F, the top plate can include a generally rectangular shape having a front side with a central opening for allowing for a hinged ring to be attached with a fastener/washer/nut 42, such as that described in U.S. Pat. No. 9,421,920 to Jang, which is incorporated by reference. Extending downward from sides 12 can be opposite facing channels/rails 12, and along a bottom can be another downwardly extending channel 14 that can function as a stopper.

Figure 3B:
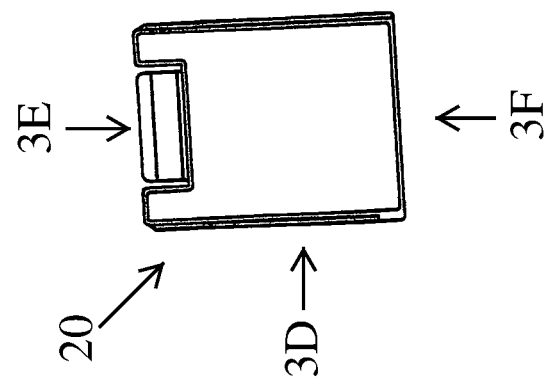
FIG. 3B is a rear view of the bottom plate of FIG. 3A.
Figure 3A:
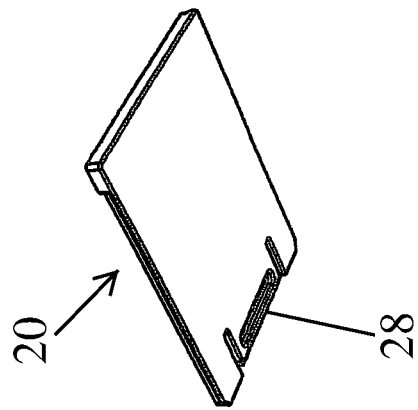
FIG. 3A is a perspective view of the front of the bottom plate of FIG. 1.
Figure 3E:
FIG. 3E is a top side view of the bottom plate of FIG. 3B.
Figure 3C:
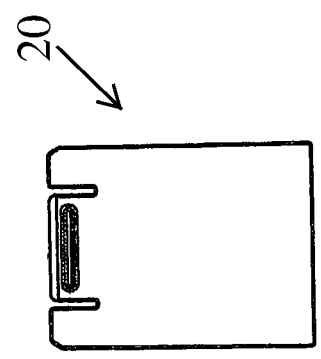
FIG. 3C is a front view of the bottom plate of FIG. 3A.
Figure 3F:
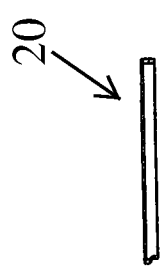
FIG. 3F is bottom side view of the bottom plate of FIG. 3B along arrow 3F.
Figure 3D:
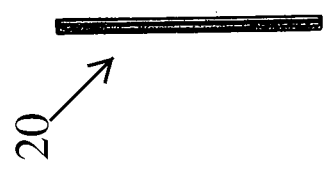
FIG. 3D is a left side view of the bottom plate of FIG. 3B.

FIG. 3A is a perspective view of the front of the bottom plate 20 of FIG. 1. FIG. 3B is a rear view of the bottom plate 20 of FIG. 3A. FIG. 3C is a front view of the bottom plate 20 of FIG. 3A. FIG. 3D is a left side view of the bottom plate 20 of FIG. 3B. FIG. 3E is a top side view of the bottom plate 20 of FIG. 3B. FIG. 3F is bottom side view of the bottom plate 20 of FIG. 3B along arrow 3F.

Referring to FIGS. 1 and 3A-3F, the bottom plate 20 can have a rectangular shape and include an elongated slot 28 adjacent to one side edge.

Figure 4B:
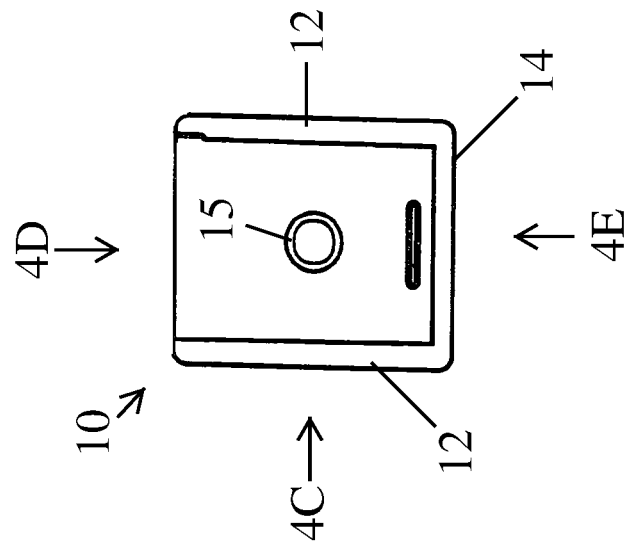
FIG. 4B is a rear view of the top plate of FIG. 4A.
Figure 4A:
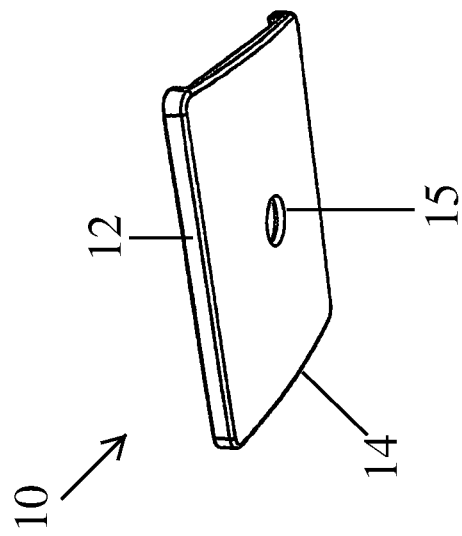
FIG. 4A is a perspective view of the front of the top plate of FIG. 1.

FIG. 4A is a perspective view of the front of the top plate 10 of FIG. 1. FIG. 4B is a rear view of the top plate 10 of FIG. 4A. FIG. 4C is a left side view of the top plate 10 of FIG. 4A along arrow 4C. FIG. 4D is a top view of the top plate 10 of FIG. 4A along arrow 4D. FIG. 4E is a bottom view of the top plate 10 of FIG. 4A along arrow 4E. FIG. 4F is a front view of the top plate 10 of FIG. 4A. Referring to FIGS. 1, 2A-2E and 4A-4F, the downwardly extending side channels/rails 12 and bottom channel/stopper 14 are more clearly shown.

Figure 5:
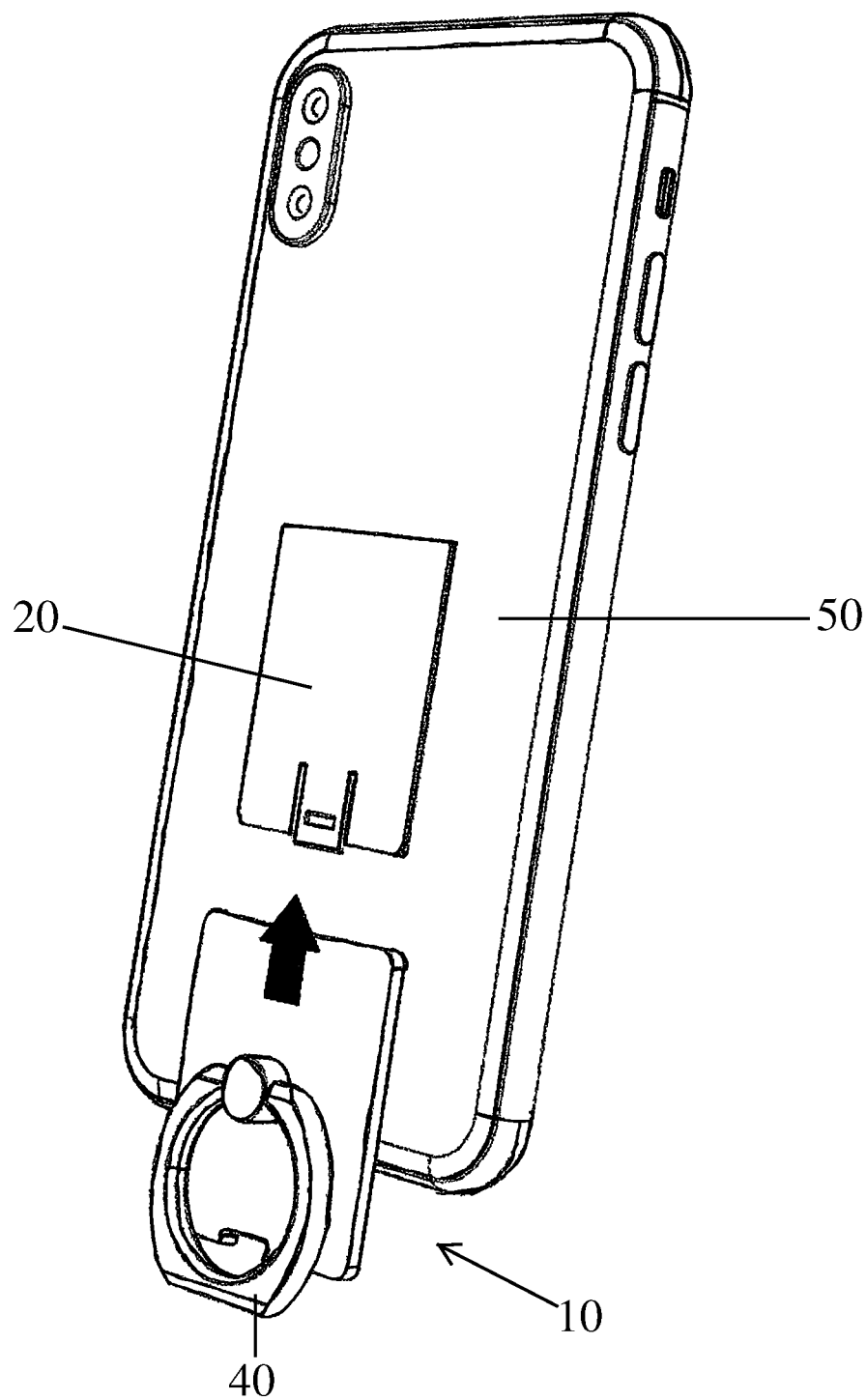
FIG. 5 shows the bottom plate of the preceding figures affixed to a case of a smart phone, with the top plate with ring holder about to slidably attached onto the bottom plate

FIG. 5 shows the bottom plate 20 of the preceding figures affixed to a case of a portable digital device 50, such as a smart phone, with the top plate 10 with ring holder 40 about to slidably attached onto the bottom plate 20.

Referring to FIGS. 1-5, the bottom plate 20 can be affixed to the surface (such as the outer case) of a portable digital device 50 with double sided adhesive tape 30. Next the top plate 10 can be oriented so that the open top end is positioned to be adjacent to a lower edge of the bottom plate 20. And the downwardly extending side channels/rails 12 on the top plate can slide about the outer side edges of the bottom plate 20, until the rear end channel 14 abuts against the lower edge of the bottom plate 20, and the elongated protruding member 18 snaps into the elongated slot of the bottom plate 20 locking the top plate 10 to the bottom plate 20.

The top plate 10 can be removed by pushing the top plate 10 in the opposite direction until the protruding member 18 becomes disengaged from the slot 28 followed by sliding the top plate 10 with ring holder 40 until the top plate 10 and ring holder 49 become completely separated from the bottom plate 20.

When the top plate 10 with ring holder 40 is completely separated from the bottom plate 20, the mobile device battery can be recharged safely as discussed and shown in FIG. 1.

In a preferred embodiment the bottom plate 20 can be made of plastic so that it does not interfere with the recharging of the portable digital device. The ring holder can be metal and the top plate 10 can be metal. Alternatively, both the top plate 10 and the bottom plate 20 can be plastic. Other combinations of materials can be used as desired.

While the preferred embodiment shows side grip edge channels extending downward from the top plate to grip about side edges of the bottom plate, the bottom plate can have upwardly extending side grip edge channels to about side edges of the top plate.

Although the base plate is describes as being fixed to the mobile device by an adhesive, other types of fastening techniques can be used such as but not limited to hook and loop fasteners, and the like.

While the preferred embodiment shows the removable ring holder stand being used for a smartphone, other types of portable digital devices can incorporate the invention, such as but not limited to tablets, portable media players, and the like. Additionally, the removable ring holder stand can be used with mobile phone accessories, such as but not limited to a selfie stick, portable charger, and the like.

Although specific advantages have been enumerated above, various embodiments may include some, none, or all of the enumerated advantages.

Other technical advantages may become readily apparent to one of ordinary skill in the art after review of the following figures and description.

It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below.

Unless otherwise specifically noted, articles depicted in the drawings are not necessarily drawn to scale.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A removable mobile device accessory, comprising:
    a first plate to be fixed to a surface of a mobile device;
    a second plate being removably attached to the first plate; and
    a ring being hinged to the second plate;
    opposite facing grip channels for allowing the second plate to slide onto the first plate;
    side edges extending downward from the second plate for supporting the opposite facing grip channels for allowing the second plate to slide over the first plate;
    a protruding member on one of the first plate and the second plate; and
    a slot on another one of the first plate and the second plate, the protruding member being inserted into the slot and configured to lock the second plate relative to the first plate,
    wherein a pair of incision portions are formed on the one of the first and second plates and at both sides of the protruding member.

2. The removable mobile device accessory of claim 1, wherein the first plate is fixed to the surface of the mobile device by an adhesive.

3. The removable mobile device accessory of claim 1, further comprising:
    a stopper for limiting a travel of the second plate to prevent it from sliding over the first plate.

4. The removable mobile device accessory of claim 1, wherein the mobile device includes: a smartphone.

5. The removable mobile device accessory of claim 1, wherein the mobile device includes: a selfie stick.

6. A removable mobile device accessory comprising:
    a first plate to be fixed to a surface of a mobile device;
    a second plate being removably attached to the first plate;
    a ring being hinged to the second plate;
    opposite facing grip channels for allowing the second plate to slide onto the first plate;
    side edges extending upward from the first plate for supporting the opposite facing grip channels for allowing the second plate to slide over the first plate;
    a protruding member on one of the first plate and the second plate; and
    a slot on another one of the first plate and the second plate, the protruding member being inserted into the slot and configured to lock the second plate relative to the first plate,
    wherein a pair of incision portions are formed on the one of the first and second plates and at both sides of the protruding member.

7. The removable mobile device accessory of claim 6, further comprising:
    a stopper for limiting a travel of the second plate to prevent sliding over the first plate.

8. A removable mobile device accessory, comprising:
    a first rectangular plate to be fixed to a surface of a mobile device;
    a second rectangular plate;
    a ring being hinged to the second rectangular plate; and
    a sliding mechanism for allowing the second rectangular plate to be removably attached to the first rectangular plate;
    opposite facing grip channels for allowing the second rectangular plate to slide onto the first rectangular plate;
    side edges extending downward from the second rectangular plate for supporting the opposite facing grip channels for allowing the second rectangular plate to slide over the first rectangular plate;

a protruding member on one of the first rectangular plate and the second rectangular plate; and a slot on another one of the first rectangular plate and the second rectangular plate, the protruding member for being inserted into the slot and configured to lock the second rectangular plate relative to the first rectangular plate, wherein a pair of incision portions are formed on the one of the first rectangular and second rectangular plates and at both sides of the protruding member.

9. The removable mobile device accessory of claim 8, wherein the first rectangular plate is fixed to the surface of the mobile device by an adhesive.

10. The removable mobile device accessory of claim 8, further comprising:

a stopper for limiting a travel of the second rectangular plate to prevent it from sliding over the first rectangular plate.

11. The removable mobile device accessory of claim 8, wherein the mobile device includes: a smartphone.

12. The removable mobile device accessory of claim 8, wherein the mobile device includes: a selfie stick.

* * * * *